(12) United States Patent
Zernach et al.

(10) Patent No.: US 8,915,286 B2
(45) Date of Patent: Dec. 23, 2014

(54) ROLLER SHADE FILLER PANEL

(75) Inventors: Gary L. Zernach, Cumming, GA (US); Nathan W. Pascarella, Buford, GA (US); Darron J. Wright, Cumming, GA (US); Travis M. Samples, Dawsonville, GA (US); Joseph Allen Dukes, Sugar Hill, GA (US); Mark A. Acklin, Mokena, IL (US); James N. Fleming, Naperville, IL (US); Samuel C. Ramey, Naperville, IL (US); Frank J. Graczyk, New Lenox, IL (US)

(73) Assignee: Panduit Corp., Tinley Park, IL (US)

( * ) Notice: Subject to any disclaimer, the term of this patent is extended or adjusted under 35 U.S.C. 154(b) by 260 days.

(21) Appl. No.: 13/314,730

(22) Filed: Dec. 8, 2011

(65) Prior Publication Data

US 2012/0152471 A1 Jun. 21, 2012

Related U.S. Application Data

(60) Provisional application No. 61/424,116, filed on Dec. 17, 2010.

(51) Int. Cl.
| | |
|---|---|
| *A47H 1/00* | (2006.01) |
| *H05K 7/20* | (2006.01) |
| *H05K 7/14* | (2006.01) |

(52) U.S. Cl.
CPC .................................. *H05K 7/1488* (2013.01)
USPC ............................................ 160/31; 361/690

(58) Field of Classification Search
USPC ............ 160/127, 23.1, 24, 29, 238, 242, 266, 160/267.1, 268, 270, 271, 290.1, 269, 280, 160/281, 31, 323.1, 353, 37, 98–103, 239, 160/240, 276, 275; 312/223.1, 312/265.1–265.6; 361/679.46, 679.49, 361/721–724
See application file for complete search history.

(56) References Cited

U.S. PATENT DOCUMENTS 1,462,171 A 7/1923 Greninger
1,608,667 A * 11/1926 Poetsch ........................ 160/23.1
(Continued)

FOREIGN PATENT DOCUMENTS

DE 3441283 A1 5/1986
DE 4207531 A1 9/1992
(Continued)

OTHER PUBLICATIONS

42U Hot/Cold Aisle Containment Curtains, webpages, http://www.42u.com/colling/hot-aisle-containment/aisle-containment-curtains.htm; undated, (3 pages).
(Continued)

*Primary Examiner* — Katherine Mitchell
*Assistant Examiner* — Jeremy Ramsey
(74) *Attorney, Agent, or Firm* — Christopher S. Clancy; James H. Williams

(57) ABSTRACT

Certain embodiments of the present invention provide an apparatus for closing off an opening above, below, or between electronic equipment in a rack. The rack includes a pair of equipment rails. The electronic equipment is mounted to the equipment rails. The apparatus includes a base, a roller shade, and a handle. The roller shade is rotatably connected to the base and includes a free end extending from the base when the roller shade is rotated. The handle is connected to the free end of the roller shade. The base is removably connected to the equipment rails at a first position. The handle is removably connected to the equipment rails at a second position spaced apart from the first position such that the free end of the roller shade is extended to close off the opening in the rack.

13 Claims, 19 Drawing Sheets

(56) References Cited

U.S. PATENT DOCUMENTS

| | | | |
|---|---|---|---|
| 2,105,783 A * | 1/1938 | Gersten | 160/267.1 |
| 3,280,893 A * | 10/1966 | Webb et al. | 160/281 |
| 3,362,461 A | 1/1968 | Stark | |
| 3,722,573 A | 3/1973 | Stark | |
| 4,220,189 A * | 9/1980 | Marquez | 160/23.1 |
| 4,649,981 A | 3/1987 | Bibeau | |
| 5,117,892 A * | 6/1992 | Murray | 160/273.1 |
| 5,307,238 A | 4/1994 | Marcus | |
| 5,402,309 A | 3/1995 | Ohgami et al. | |
| 5,655,587 A | 8/1997 | Kraler | |
| 5,881,792 A | 3/1999 | Cheng | |
| 5,887,637 A | 3/1999 | Phyper | |
| 6,181,549 B1 | 1/2001 | Mills et al. | |
| 6,227,756 B1 * | 5/2001 | Dube et al. | 403/353 |
| 6,234,593 B1 | 5/2001 | Chen et al. | |
| 6,407,912 B1 | 6/2002 | Chen et al. | |
| 6,453,491 B1 | 9/2002 | Wells et al. | |
| 6,601,932 B1 | 8/2003 | Helgenberg et al. | |
| 6,688,374 B2 | 2/2004 | Dondlinger | |
| 6,695,149 B1 | 2/2004 | Cote et al. | |
| 6,758,353 B2 | 7/2004 | Orr | |
| 6,817,402 B1 | 11/2004 | Fraczek et al. | |
| 6,826,057 B1 | 11/2004 | Gundogan et al. | |
| 6,925,843 B1 | 8/2005 | Pols Sandhu et al. | |
| 6,940,297 B2 | 9/2005 | Hall | |
| 7,077,710 B2 | 7/2006 | Haggay et al. | |
| 7,174,940 B2 | 2/2007 | Nien | |
| 7,205,481 B2 | 4/2007 | Higbie | |
| 7,262,972 B1 | 8/2007 | Gundogan et al. | |
| 7,267,156 B2 | 9/2007 | Byeon | |
| 7,337,823 B2 | 3/2008 | Wieczorek et al. | |
| 7,415,740 B1 | 8/2008 | Kemper | |
| D577,360 S | 9/2008 | Sempliner et al. | |
| 7,506,768 B2 | 3/2009 | Rassmussen et al. | |
| D596,184 S | 7/2009 | Sempliner et al. | |
| D596,185 S | 7/2009 | Sempliner et al. | |
| D596,186 S | 7/2009 | Sempliner et al. | |
| 7,617,859 B2 | 11/2009 | Auger | |
| 7,779,887 B2 | 8/2010 | Hammond et al. | |
| 8,413,385 B2 * | 4/2013 | Mahoney | 52/36.2 |
| 2003/0221796 A1 | 12/2003 | Schaller, Jr. | |
| 2003/0221797 A1 | 12/2003 | Schaller, Jr. | |
| 2004/0227435 A1 | 11/2004 | Rasmussen | |
| 2004/0232098 A1 | 11/2004 | Orr | |
| 2005/0157472 A1 | 7/2005 | Malone et al. | |
| 2007/0175108 A1 | 8/2007 | Stein et al. | |
| 2008/0142171 A1 * | 6/2008 | Koop et al. | 160/243 |
| 2008/0310126 A1 | 12/2008 | Lakoduk et al. | |
| 2008/0316702 A1 * | 12/2008 | Donowho et al. | 361/692 |
| 2009/0059486 A1 | 3/2009 | Taylor | |
| 2009/0178985 A1 | 7/2009 | Sempliner et al. | |
| 2009/0250174 A1 * | 10/2009 | Cloninger et al. | 160/23.1 |
| 2010/0000953 A1 | 1/2010 | Shew et al. | |
| 2010/0014823 A1 | 1/2010 | Krampotich et al. | |
| 2010/0061057 A1 | 3/2010 | Dersch et al. | |
| 2010/0108272 A1 * | 5/2010 | Karidis | 160/238 |
| 2011/0108207 A1 * | 5/2011 | Mainers et al. | 160/87 |
| 2011/0175505 A1 | 7/2011 | Linhares, Jr. et al. | |

FOREIGN PATENT DOCUMENTS

| | | |
|---|---|---|
| GB | 2139681 A | 11/1984 |
| GB | 2203631 A | 10/1988 |
| GB | 2410134 A | 7/2005 |
| JP | 200196264 A | 7/2000 |
| TW | 237673 | 8/2005 |
| WO | 2006044740 A2 | 4/2006 |
| WO | 2009025838 A1 | 2/2009 |

OTHER PUBLICATIONS

SharkRack, Inc. Tool-less Filler Panel Pack, 1U x 5, webpage, 2009, (1 pg.).

Plenafill® 27U Scalable Blanking Panel, webpages, http://www.plenaform.com/PlenaFill.htm, Sep. 9, 2008 (2 pages).

\* cited by examiner

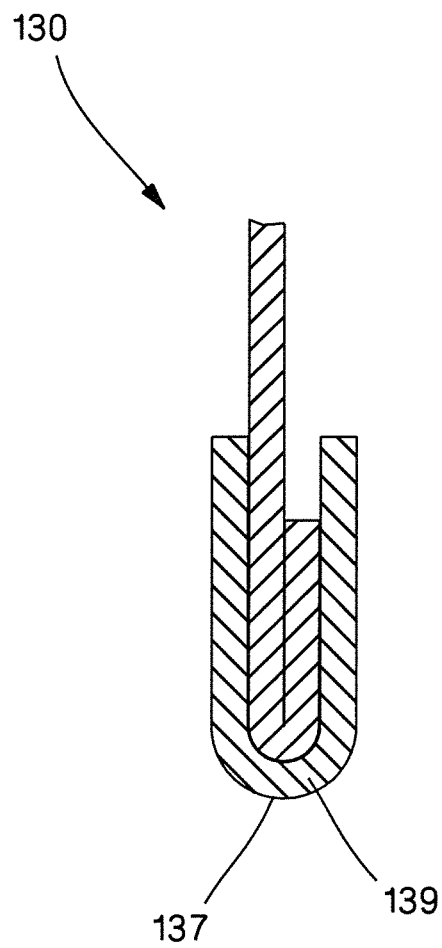
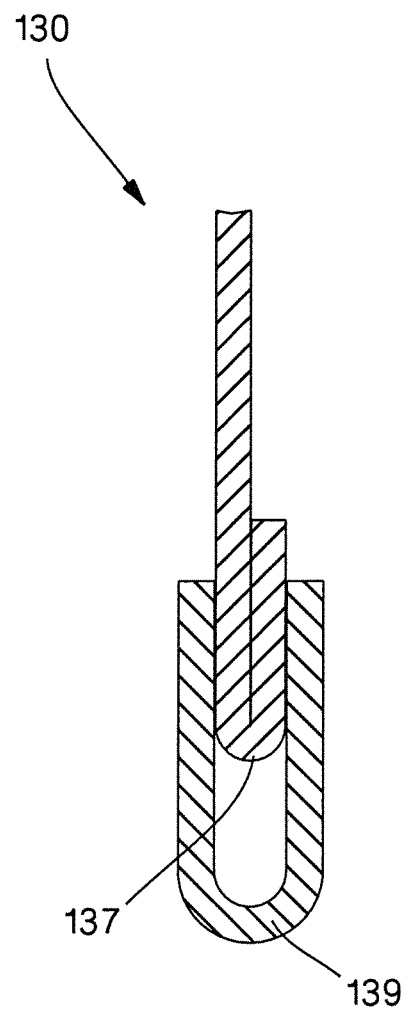
FIG.19
FIG.20

US 8,915,286 B2

ROLLER SHADE FILLER PANEL

CROSS REFERENCE TO RELATED APPLICATIONS

This application claims priority to U.S. Provisional Patent Application No. 61/424,116, filed on Dec. 17, 2010, which is incorporated by reference in its entirety.

BACKGROUND OF THE INVENTION

The present invention relates to a filler panel, and more particularly, a roller shade filler panel for a rack.

Filler panels are well known in the art. Typically, filler panels are capable of accommodating only one size of opening However, as electronic equipment is added to and subtracted from a rack, the size of the opening changes. Therefore, there is a need for a filler panel that is capable of accommodating more than one size of opening.

SUMMARY OF THE INVENTION

Certain embodiments of the present invention provide an apparatus for closing off an opening above, below, or between electronic equipment in a rack. The rack includes a pair of equipment rails. The electronic equipment is mounted to the equipment rails. The apparatus includes a base, a roller shade, and a handle. The roller shade is rotatably connected to the base and includes a free end extending from the base when the roller shade is rotated. The handle is connected to the free end of the roller shade. The base is removably connected to the pair of equipment rails at a first position. The handle is removably connected to the pair of equipment rails at a second position spaced apart from the first position such that the free end of the roller shade is extended to close off the opening in the rack.

BRIEF DESCRIPTION OF THE DRAWINGS

FIG. 19 is an enlarged view of the handle of FIG. 15, showing the adjustable edge seal on the bottom edge of the base in a retracted position;

FIG. 20 is an enlarged view of the handle of FIG. 15, showing the adjustable edge seal on the bottom edge of the base in an extended position;

DETAILED DESCRIPTION

FIGS. 1-14 illustrate a roller shade filler panel 100 for a rack 10, such as a 2-post rack or a 4-post rack, which may also be referred to as a cabinet or an enclosure, according to an embodiment of the present invention.

Figure 1:
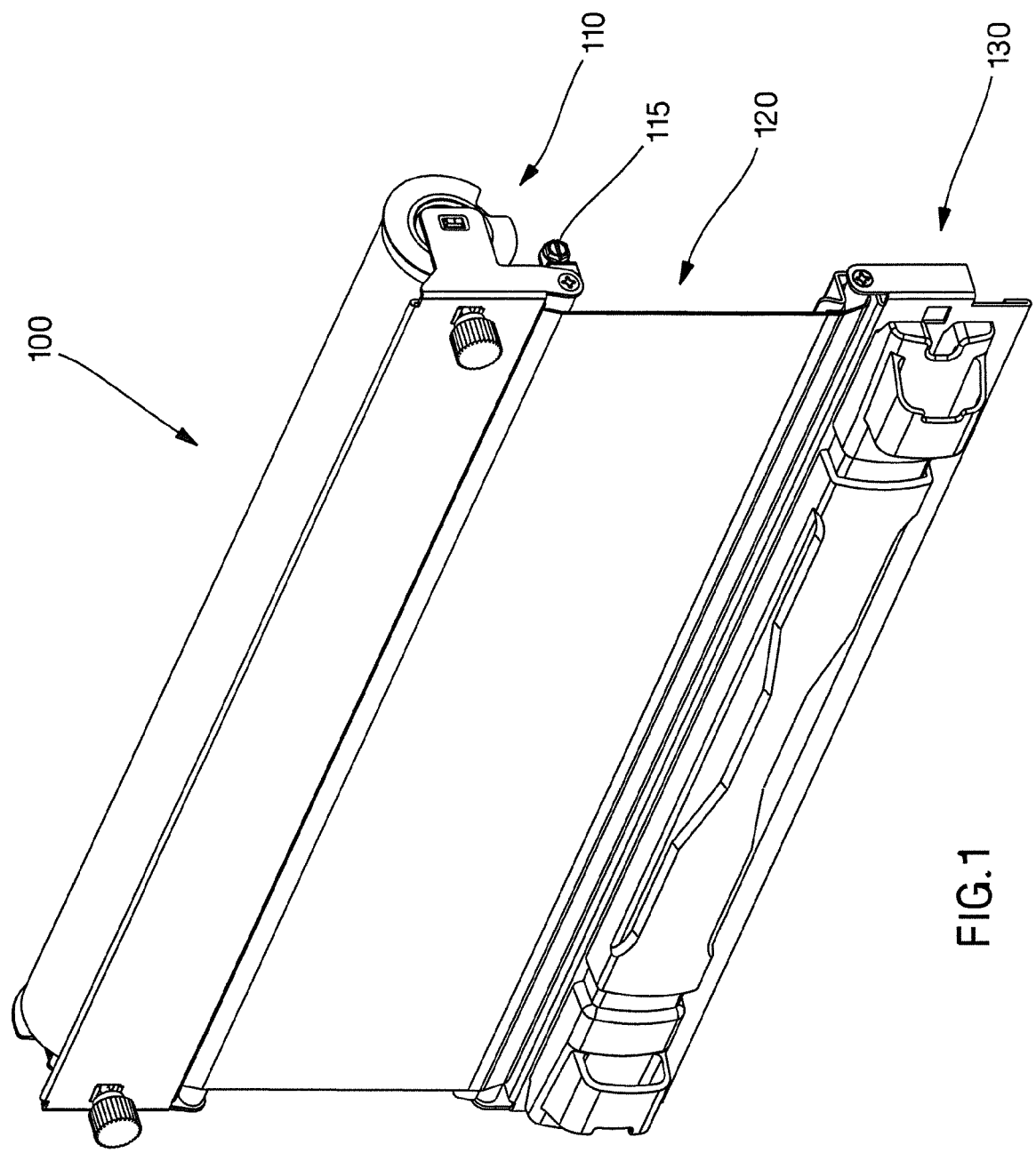
FIG. 1 is a perspective view of a roller shade filler panel for a rack according to an embodiment of the present invention.

As best seen in FIG. 1, the roller shade filler panel 100 includes a base 110, a roller shade 120 rotatably connected to the base 110, and a handle 130 connected to a free end 122 of the roller shade 120. The roller shade 120 rotates from a retracted position (FIG. 1) to an extended position (FIGS. 4, 9-12, and 14). Preferably, the roller shade 120 is under constant tension so that it will return to the retracted position, but it is likewise contemplated that the roller shade 120 includes a tension-relieving device, for example, similar to that of a seat belt or a window shade.

Figure 2:
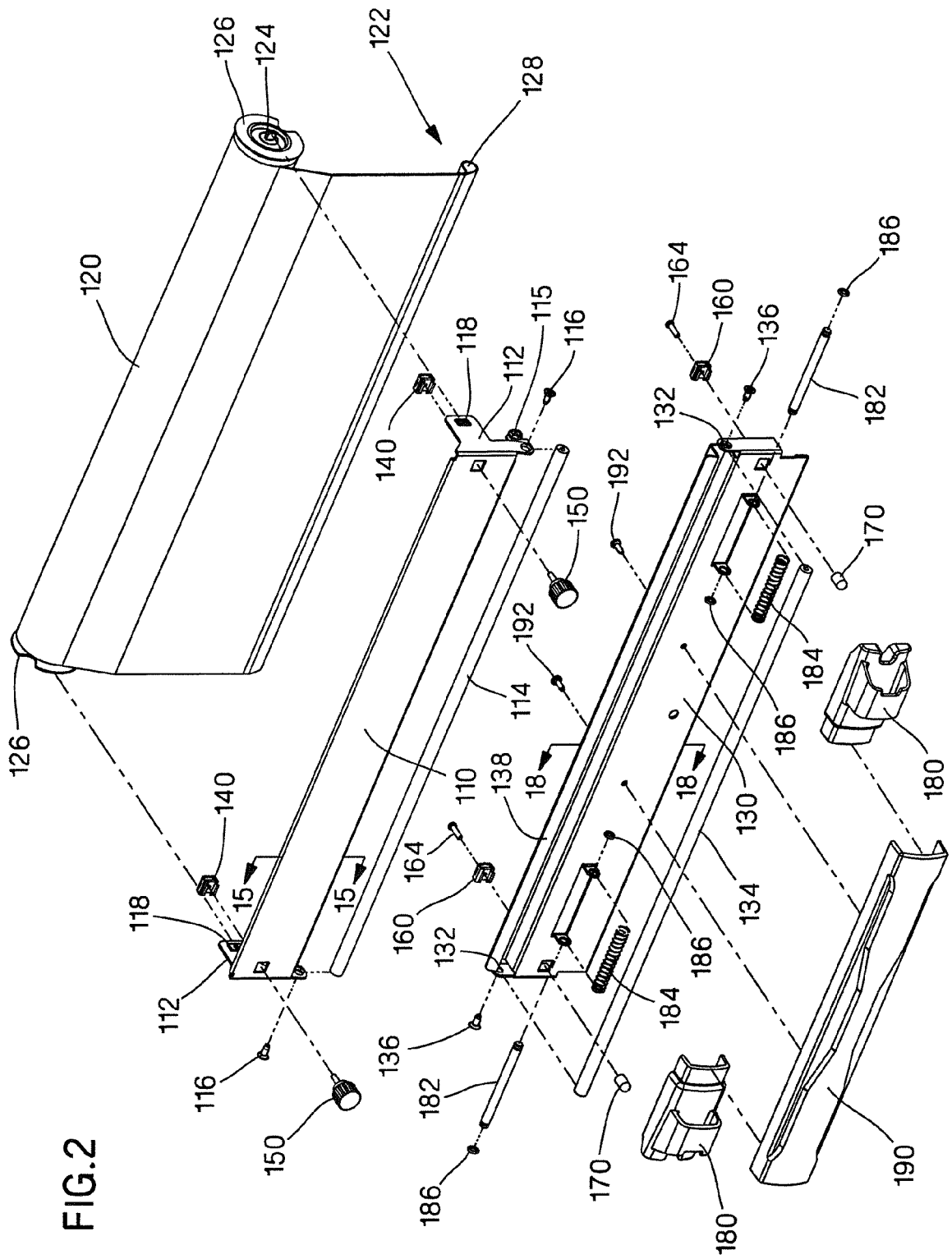
FIG. 2 is an exploded view of the roller shade filler panel of FIG. 1.

As best seen in FIG. 2, the base 110 includes a pair of side flanges 112. The side flanges 112 are for mounting the roller shade 120 to the base 110. Additionally, the side flanges 112 are for mounting a roller shade guide rod 114 to the base 110. The roller shade guide rod 114 is secured to the base 110 by a pair of fasteners 116. The roller shade guide rod 114 is for aligning the roller shade 120 with the front of the base 110.

As shown in FIGS. 1 and 2, the base 110 includes a grounding fastener 115, for example, mounted between one of the side flanges 112 and the grounding rod 114, for grounding the roller shade filler panel 100.

As best seen in FIG. 2, the roller shade 120 includes a pair of pins 124 for engaging the side flanges 112 of the base 110 and a pair of end caps 126 for minimizing "walking" as the roller shade 120 retracts. Preferably, the side flanges 112 include embossed regions 118 for engaging the pins 124 and the end caps 126, and minimizing side-to-side movement of the roller shade 120.

Additionally, as best seen in FIG. 2, the handle 130 includes a pair of side flanges 132. The side flanges 132 are for mounting a roller shade mounting rod 134 to the handle 130. The free end 122 of the roller shade 120 includes a loop 128. The roller shade mounting rod 134 is positioned through the loop 128 and secured to the handle 130 by a pair of fasteners 136. Additionally, the handle 130 includes a top flange 138. The top flange 138 is for aligning the roller shade 120 with the front of the handle 130.

Figure 3:
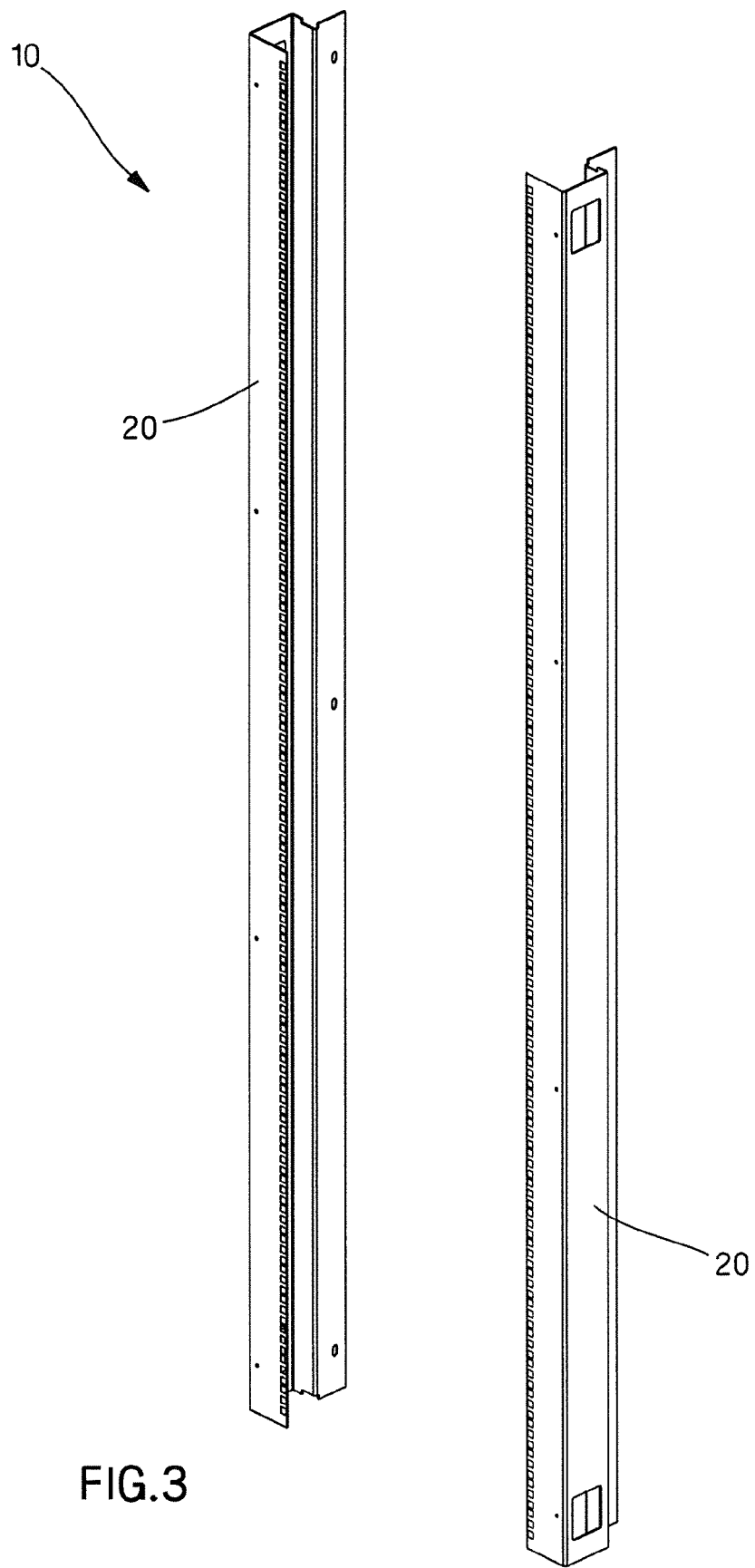
FIG. 3 is a perspective view of a portion of a rack.

As best seen in FIG. 3, the rack 10 includes a pair of equipment rails 20, which may also be referred to as channels or posts. Other components of the rack 10, such as floor mounting brackets and adjustable shelves, as well as additional equipment rails, channels, and posts, have been omitted for clarity.

Figure 4:
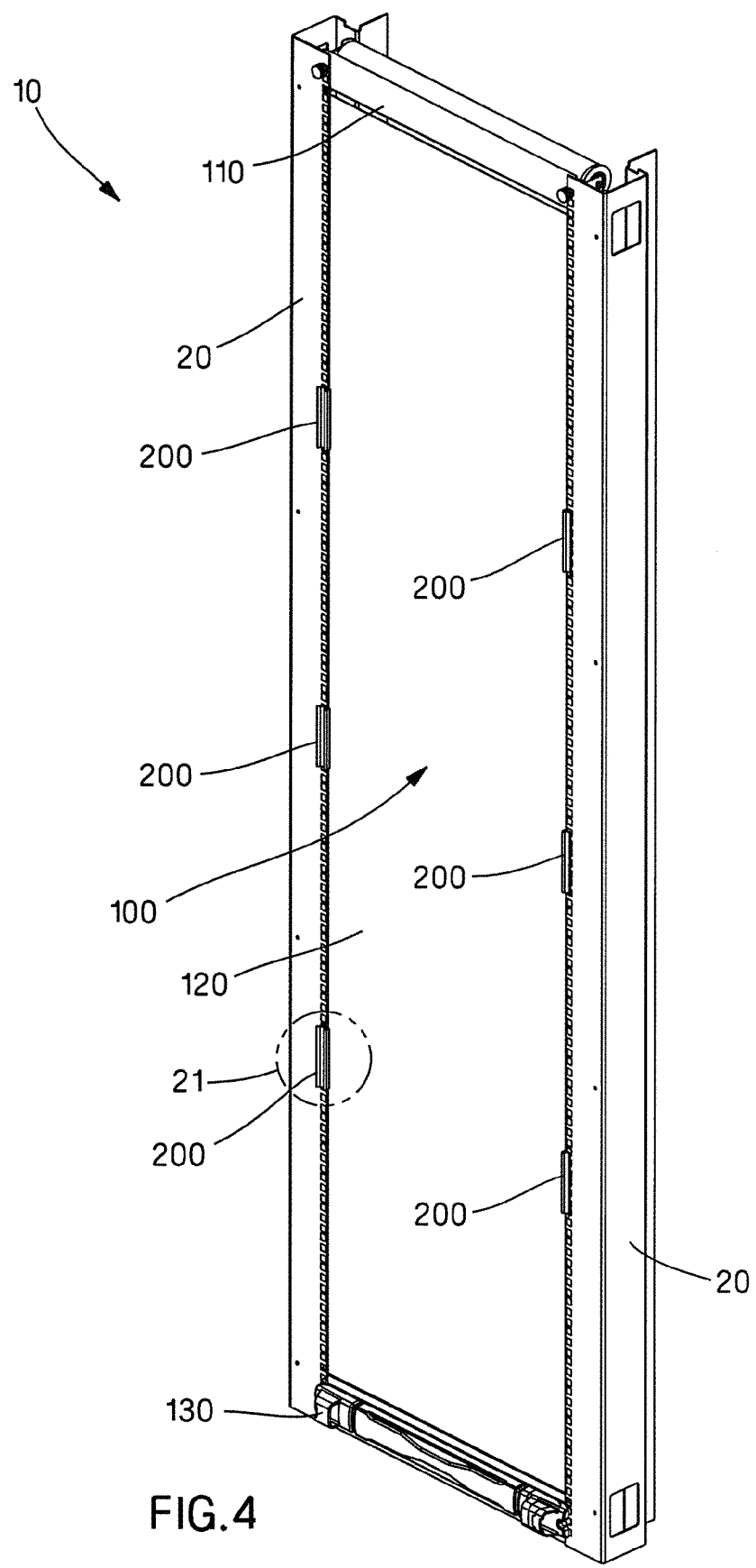
FIG. 4 is a perspective view of the roller shade filler panel of FIG. 1 installed in the rack of FIG. 3.

As shown in FIG. 4, the roller shade filler panel 100 is positioned in the rack 10 and extends from the top of the equipment rails 20 to the bottom of the equipment rails 20, closing off the opening between the equipment rails 20.

Figure 5:
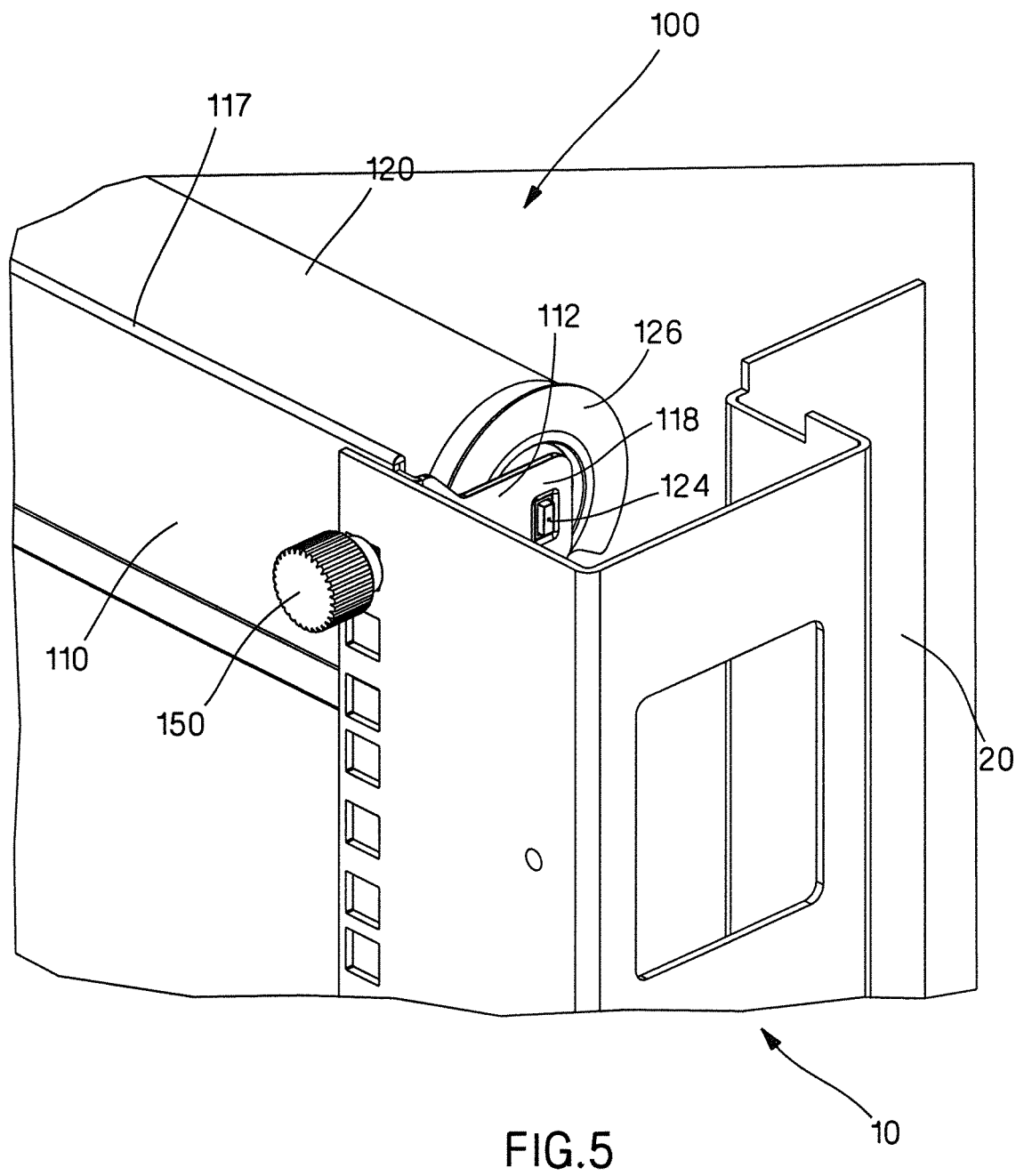
FIG. 5 is an enlarged view of the roller shade filler panel of FIG. 4, showing one side of the base removably connected to the equipment rail.
Figure 7:
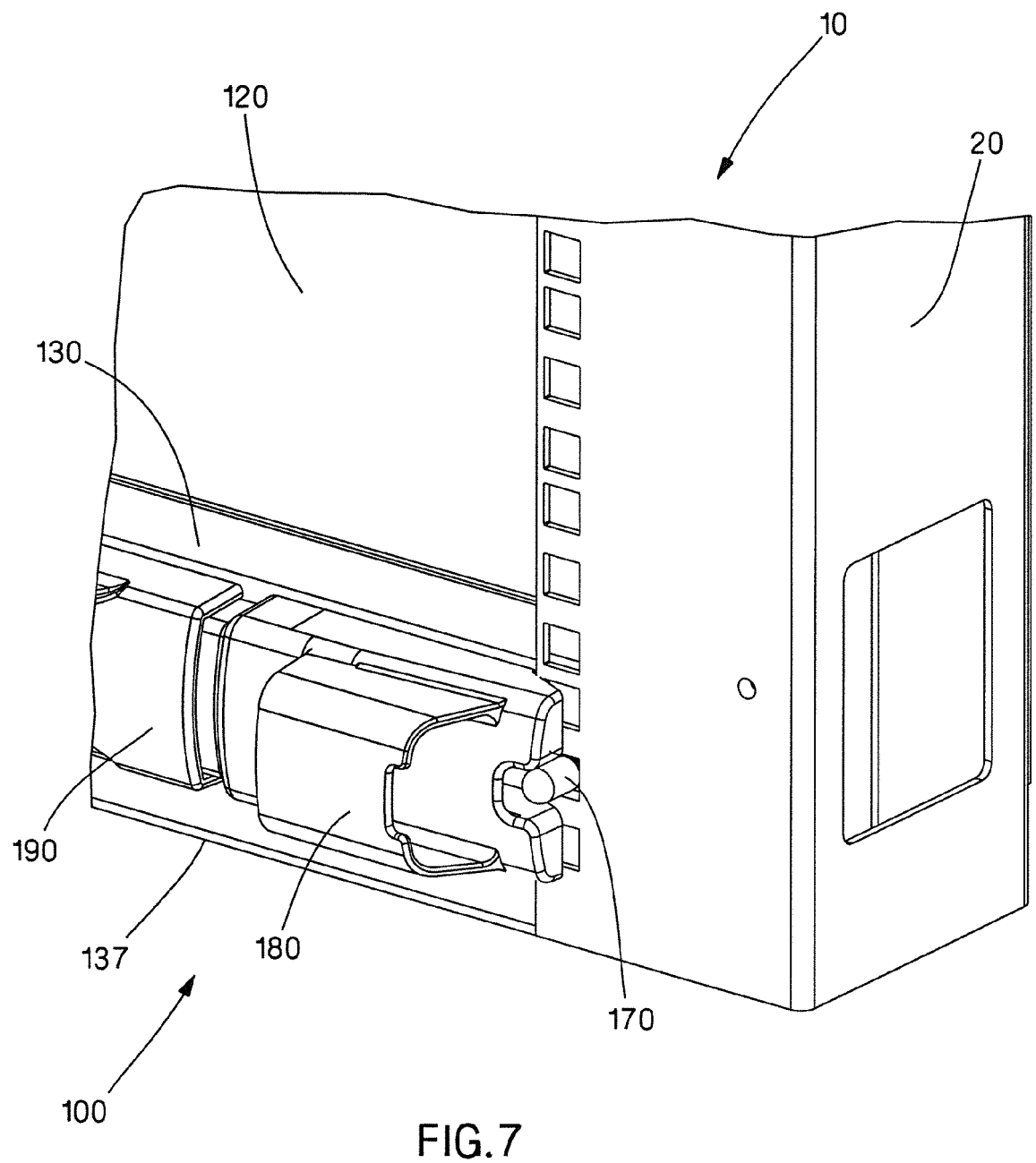
FIG. 7 is an enlarged view of the roller shade filler panel of FIG. 4, showing one side of the handle removably connected to the equipment rail.

The roller shade filler panel 100 is removably connected to the equipment rails 20. For example, as shown in FIG. 5, the base 110 is removably connected to the equipment rails 20 by a floating cage nut 140 and a threaded thumb screw knob 150. Similarly, as shown in FIG. 7, the handle 130 is removably connected to the equipment rails 20 by a floating cage nut 160, a bullet 170, and a pair of latches 180, each of which is slidably connected to the handle 130 by a shaft 182, a spring 184, a pair of o-rings 186, and a pair of front flanges 188. Additionally, as best seen in FIG. 2, the handle 130 includes a latch cover 190 for covering proximate ends of the latches 180. The cover 190 is secured to the handle 130 by a pair of fasteners 192.

Figure 6:
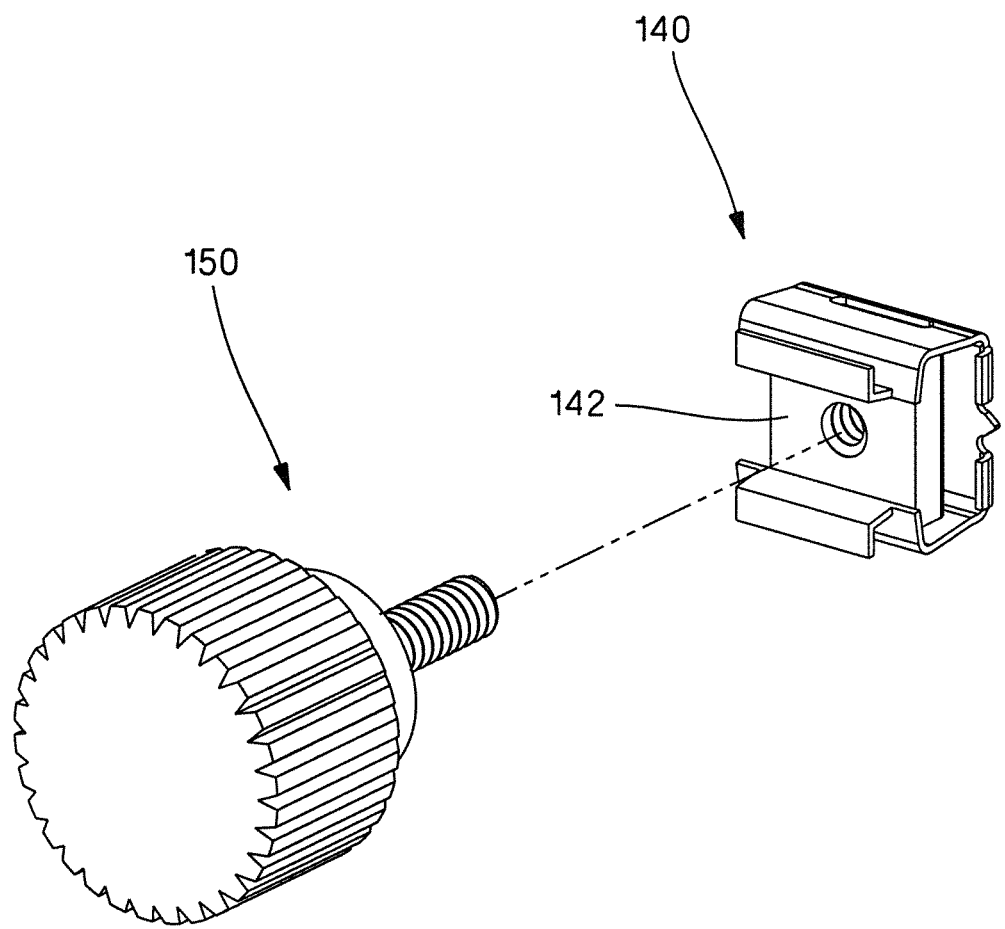
FIG. 6 is an exploded view of a floating cage nut and a threaded thumb screw knob for the base of FIG. 5.
Figure 8:
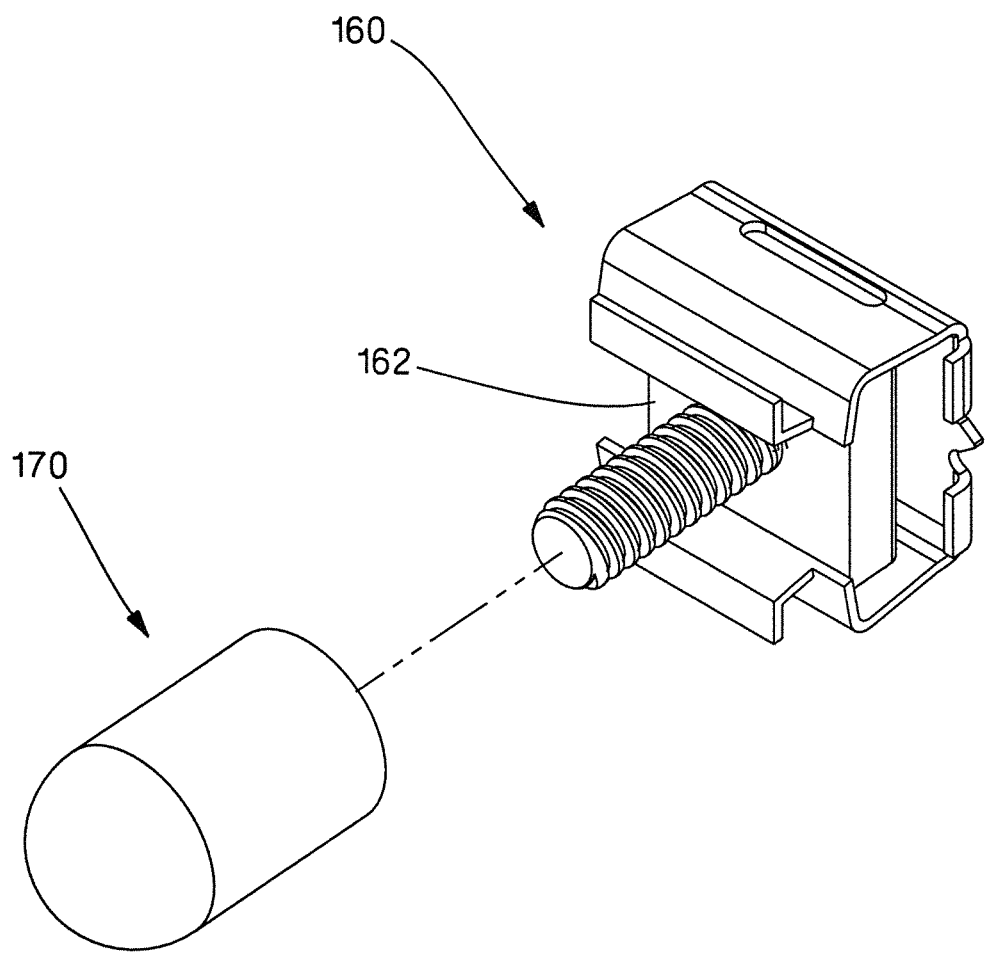
FIG. 8 is an exploded view of a floating cage nut and a bullet for the handle of FIG. 7.

As shown in FIG. 6, the floating cage nut 140 includes a floating portion 142 for accommodating non-standard spacing between the equipment rails 20. Similarly, as shown in FIG. 8, the floating cage nut 160 includes a floating portion 162 for accommodating non-standard spacing between the equipment rails 20, as well as a fastener 164 for engaging the bullet 170. It is likewise contemplated that the roller shade filler panel 100 includes a standard cage nut.

Figure 9:
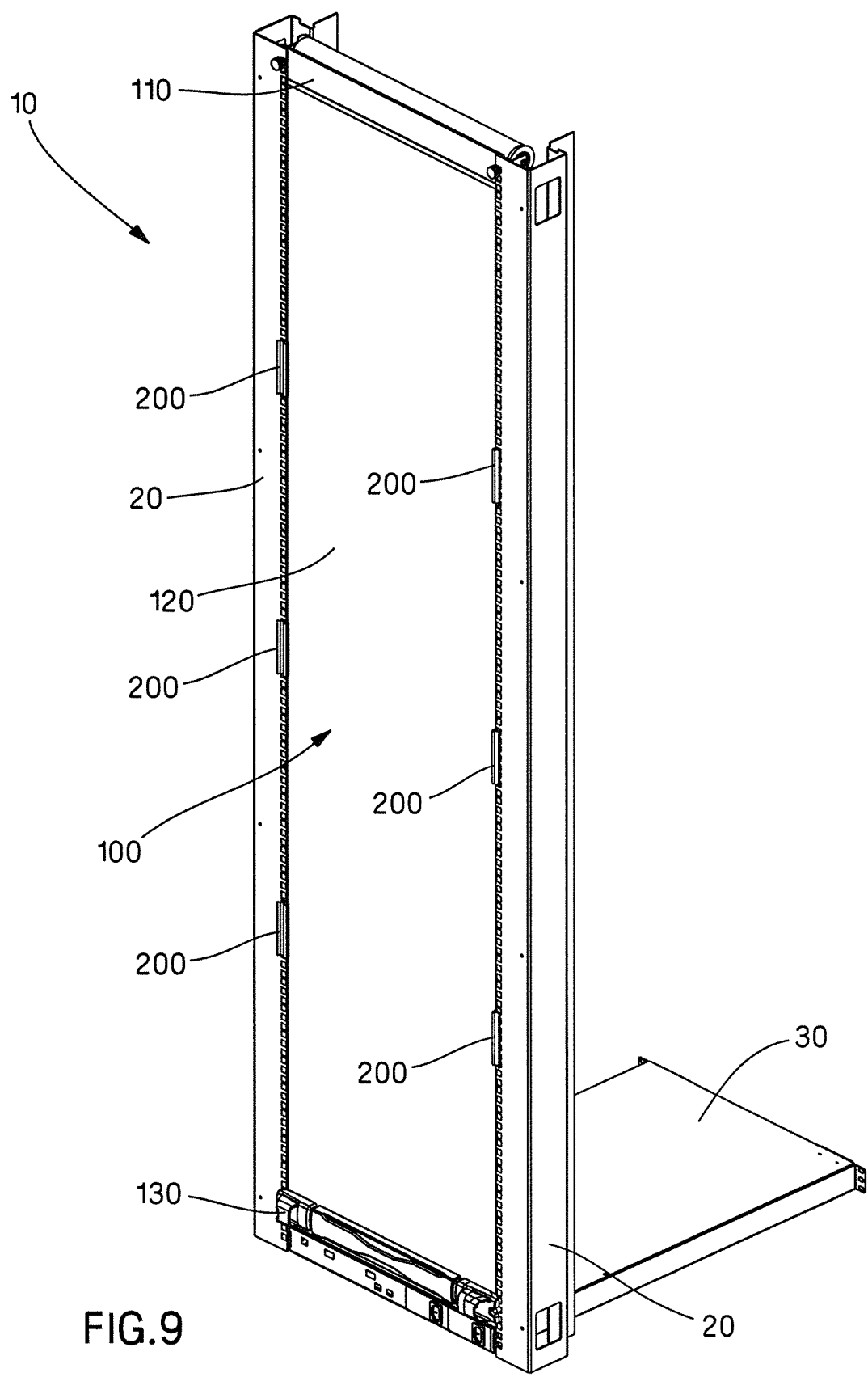
FIG. 9 is a perspective view of the roller shade filler panel of FIG. 4, showing the handle repositioned to accommodate equipment installed below the roller shade filler panel.
Figure 10:
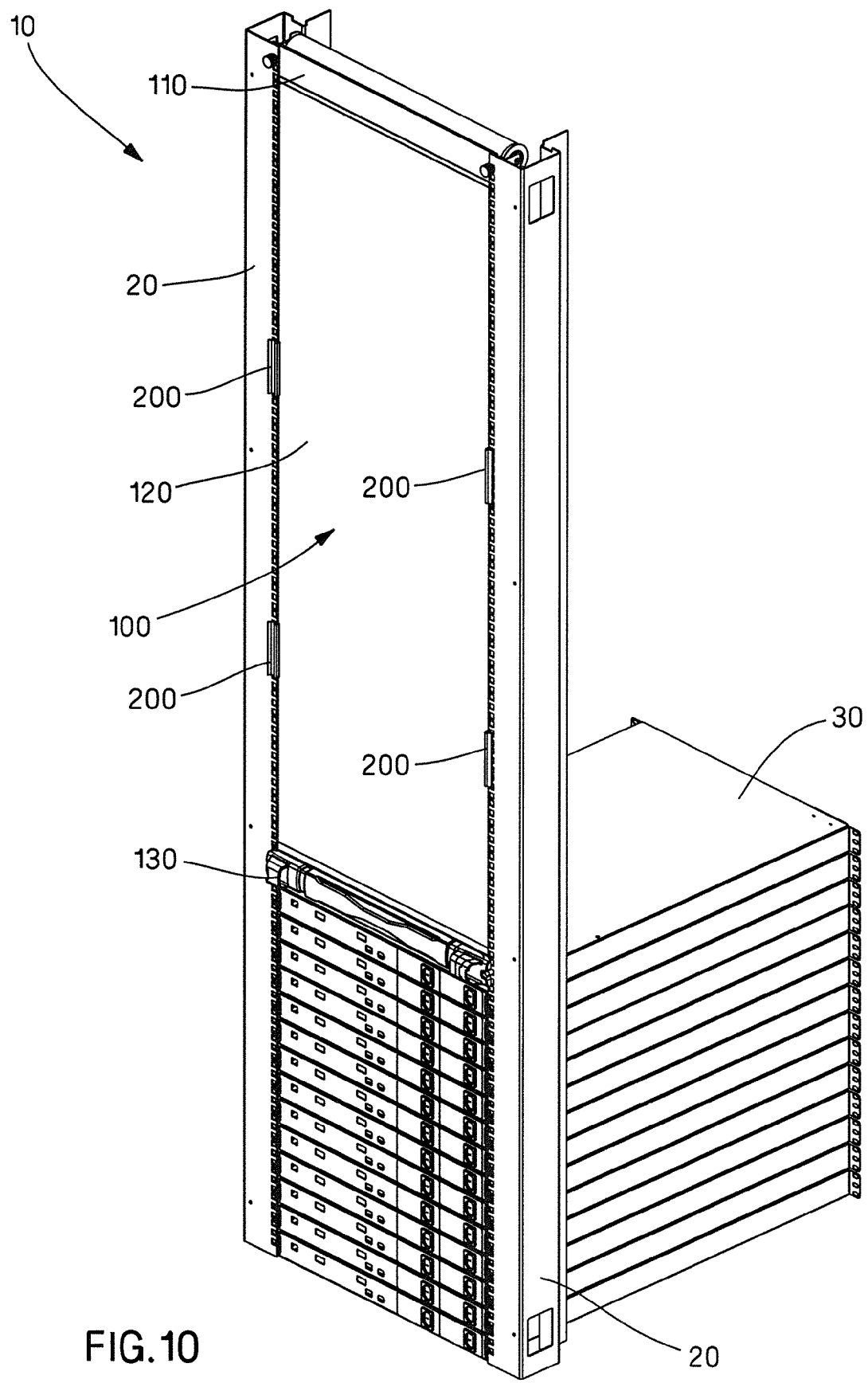
FIG. 10 is a perspective view of the roller shade filler panel of FIG. 9, showing the handle repositioned to accommodate additional equipment installed below the roller shade filler panel.
Figure 11:
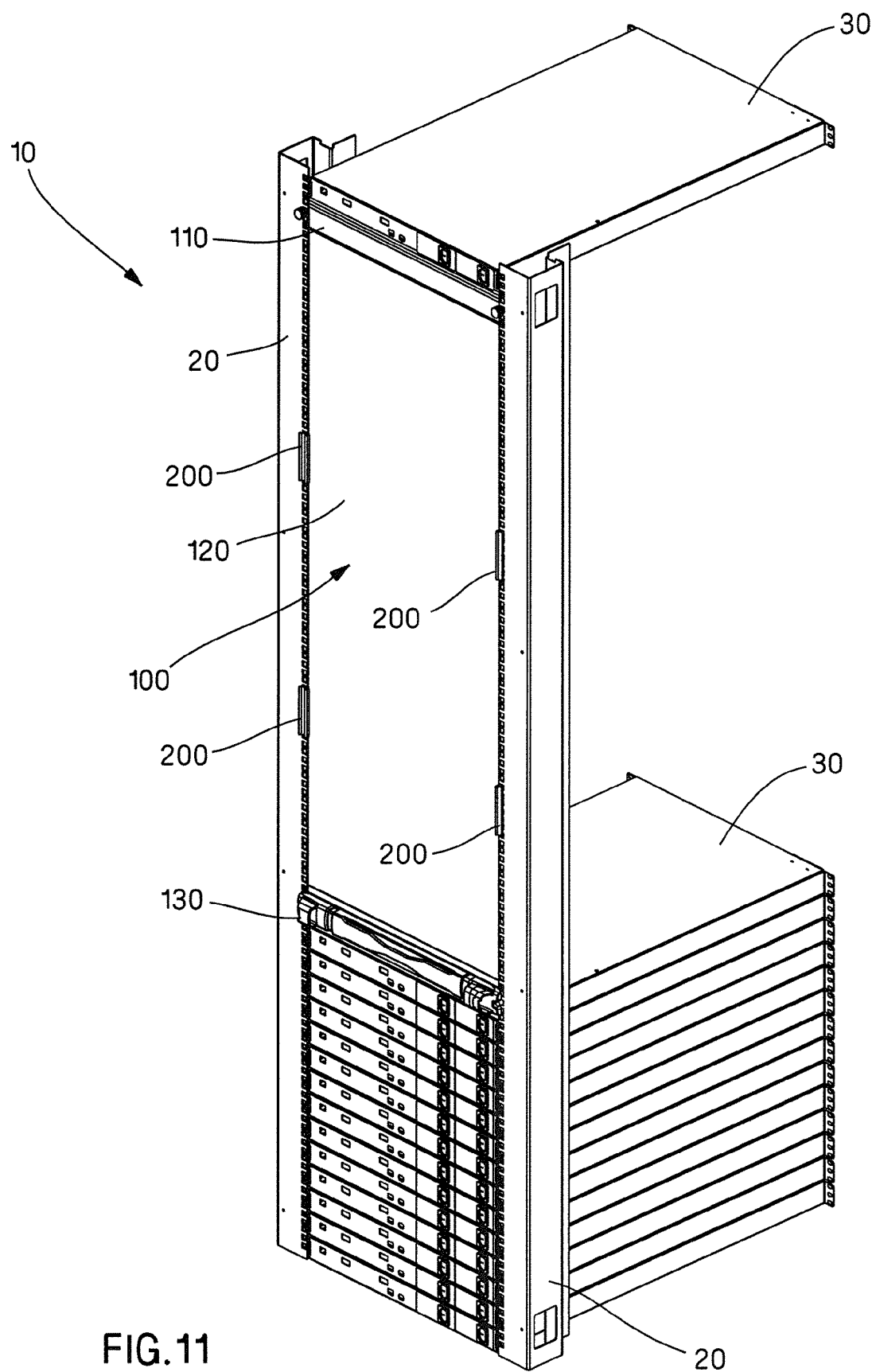
FIG. 11 is a perspective view of the roller shade filler panel of FIG. 10, showing the base repositioned to accommodate equipment installed above the roller shade filler panel.
Figure 12:
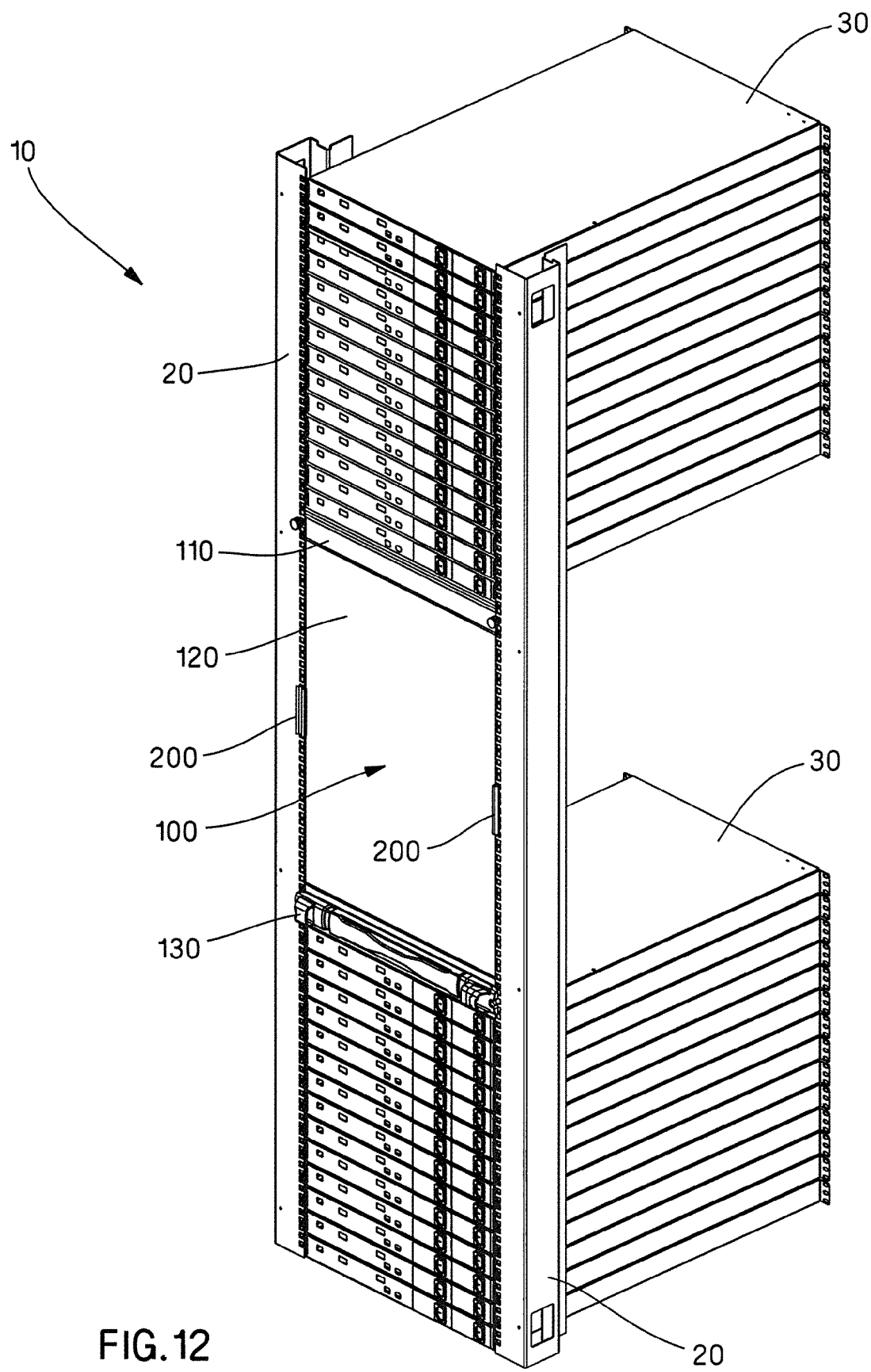
FIG. 12 is a perspective view of the roller shade filler panel of FIG. 11, showing the base repositioned to accommodate additional equipment installed above the roller shade filler panel.

As shown in FIGS. 9-12, the roller shade filler panel 100 is repositioned to accommodate equipment 30, such as servers, switches, and patch panels, as the equipment 30 is installed in the rack 10. For example, as shown in FIGS. 9 and 10, without removing the base 130 from the equipment rails 20, the handle 130 is repositioned to accommodate equipment 30 installed below the roller shade filler panel 100. Similarly, as shown in FIGS. 11 and 12, without removing the handle 130 from the equipment rails 20, the base 110 is repositioned to accommodate equipment 30 installed above the roller shade filler panel 100.

Figure 13:
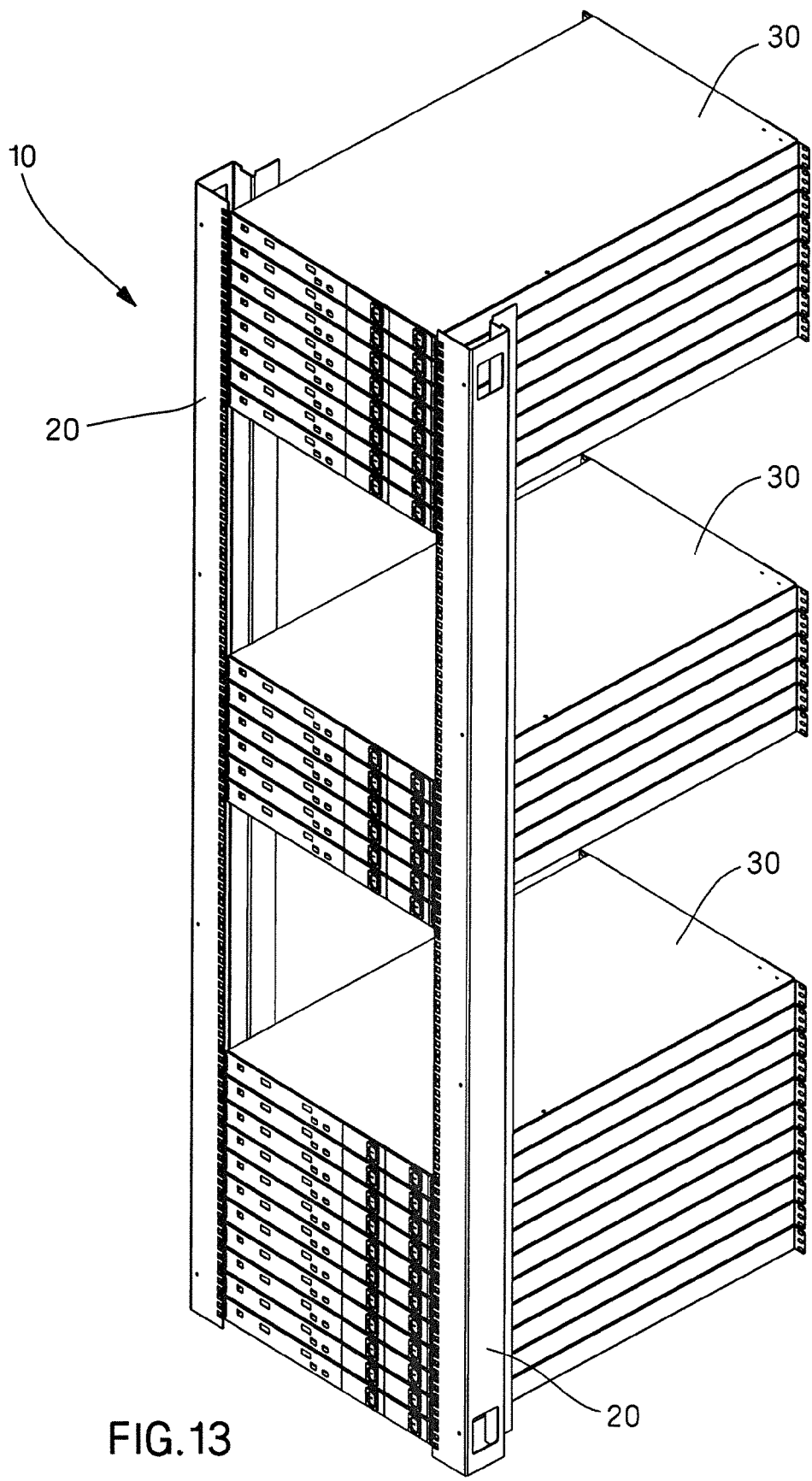
FIG. 13 is a perspective view of the rack of FIG. 3, showing equipment installed at various locations along the equipment rails.
Figure 14:
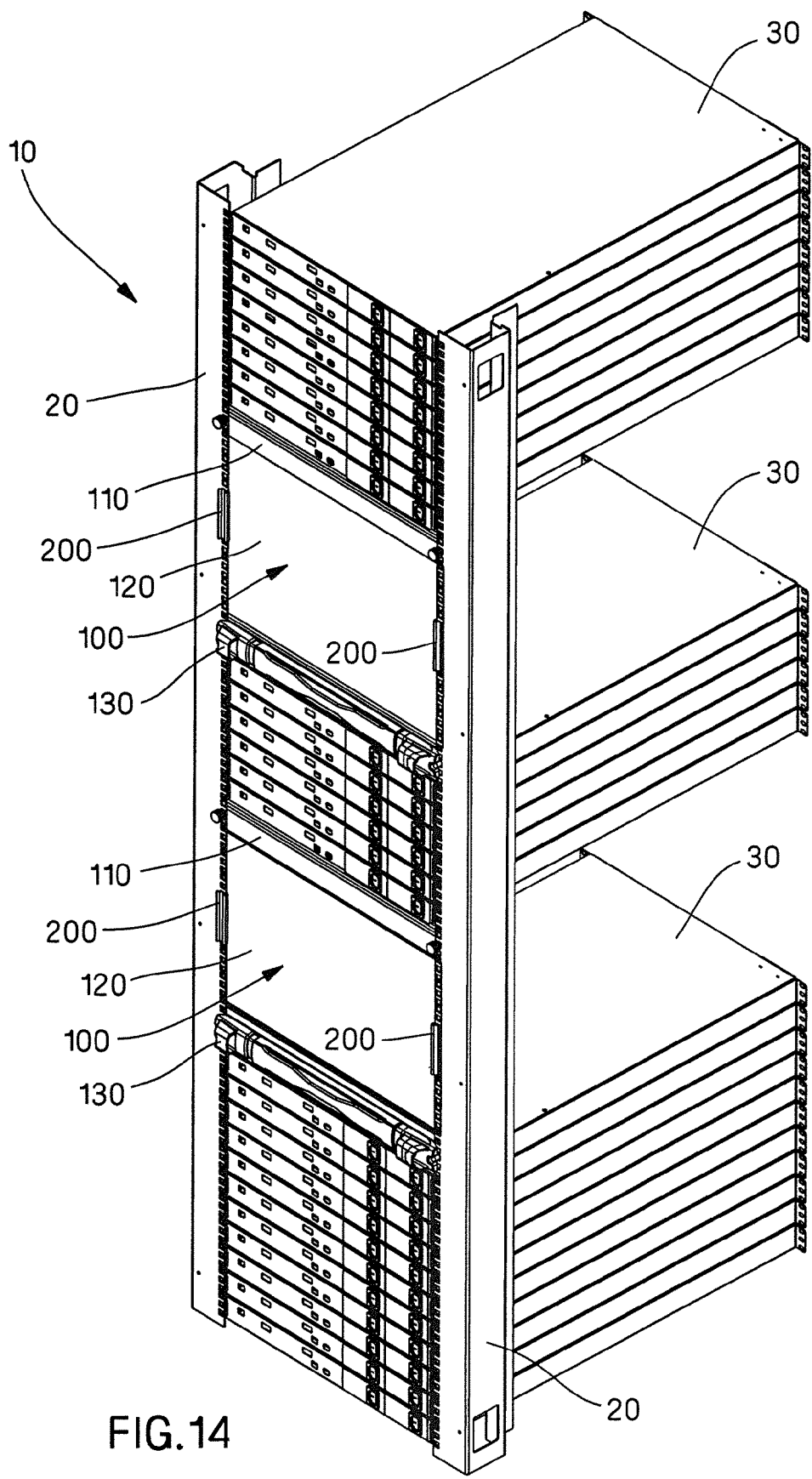
FIG. 14 is a perspective view of the roller shade filler panel of FIG. 1, showing two of the roller shade filler panels of FIG. 1 positioned between the equipment in the rack of FIG. 13.

Alternatively, as shown in FIGS. 13 and 14, two roller shade filler panels 100 are positioned between the equipment 30.

Figure 15:
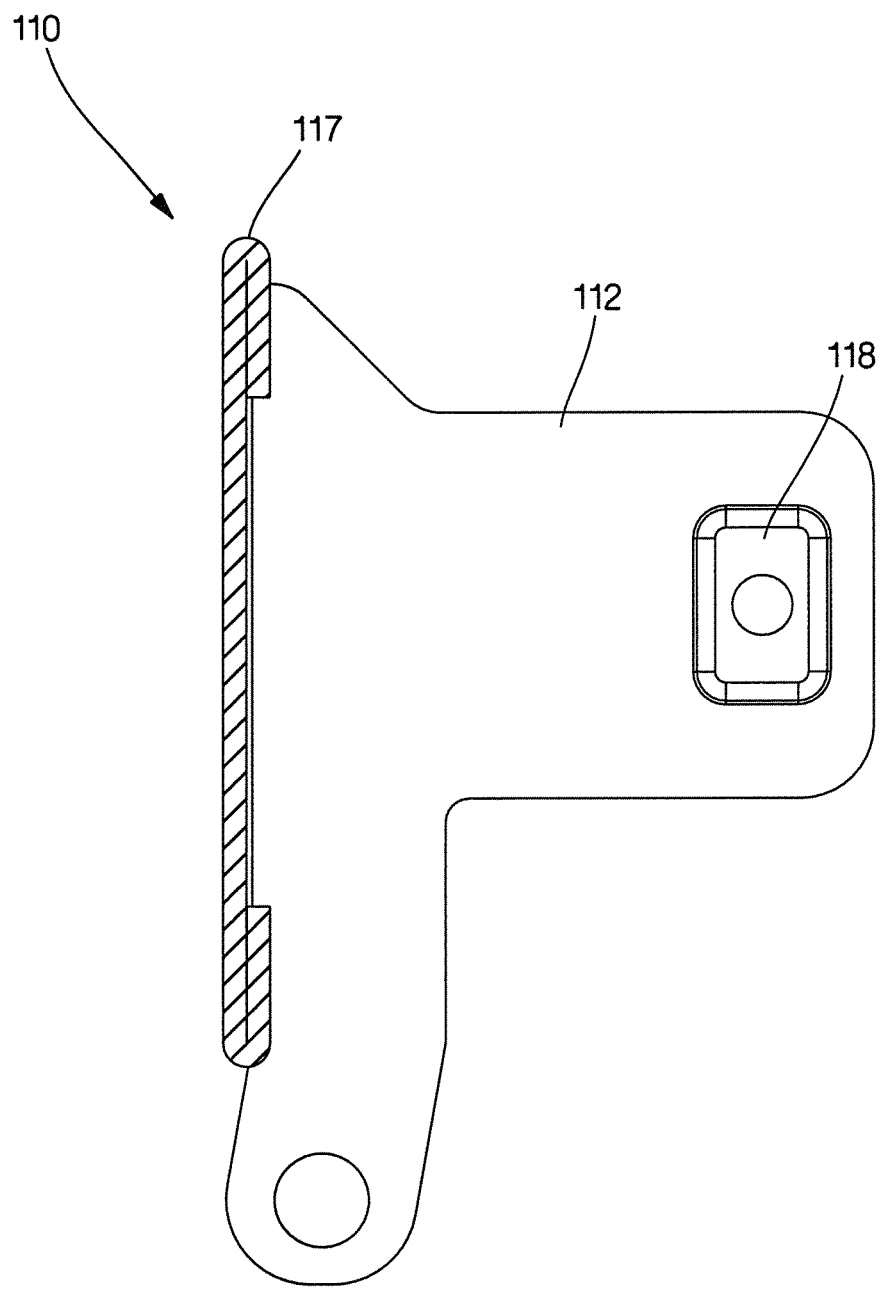
FIG. 15 is a cross-sectional view taken along line 15-15 of FIG. 2, showing the base of the roller shade filler panel.
Figure 16:
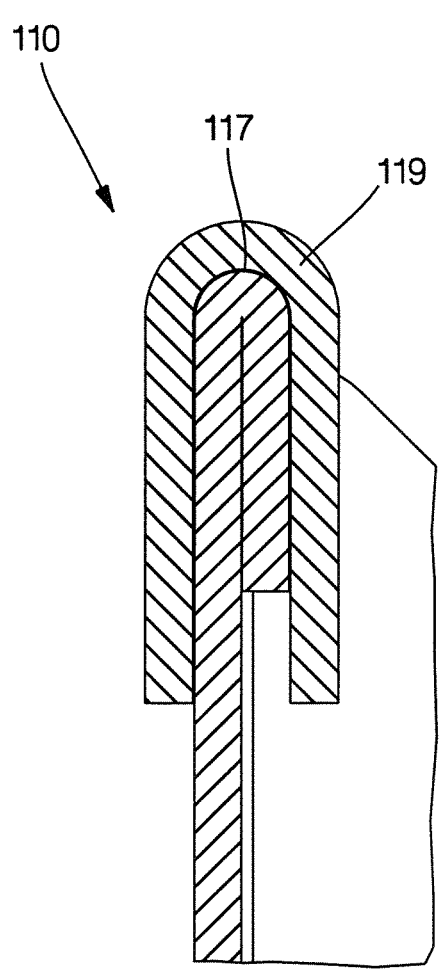
FIG. 16 is an enlarged view of the base of FIG. 15, showing the adjustable edge seal on the top edge of the base in a retracted position.
Figure 17:
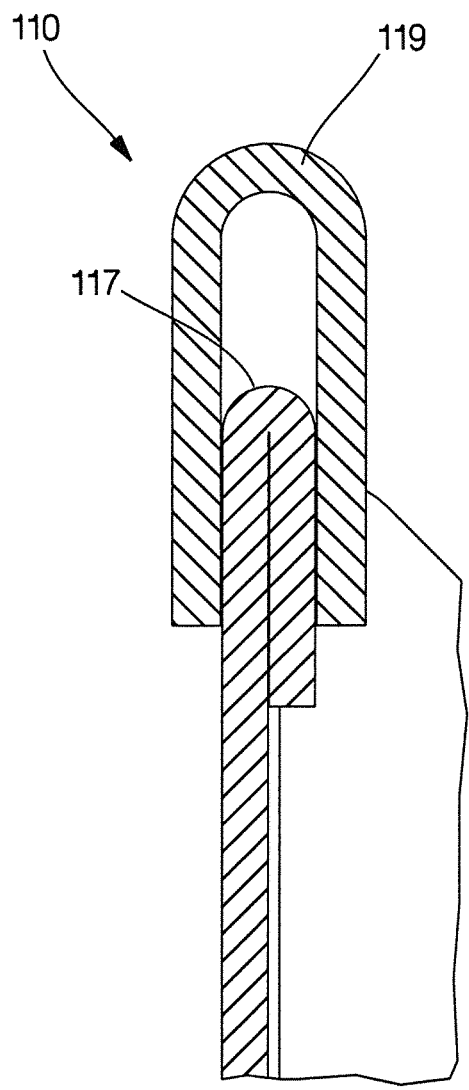
FIG. 17 is an enlarged view of the base of FIG. 15, showing the adjustable edge seal on the top edge of the base in an extended position.
Figure 18:
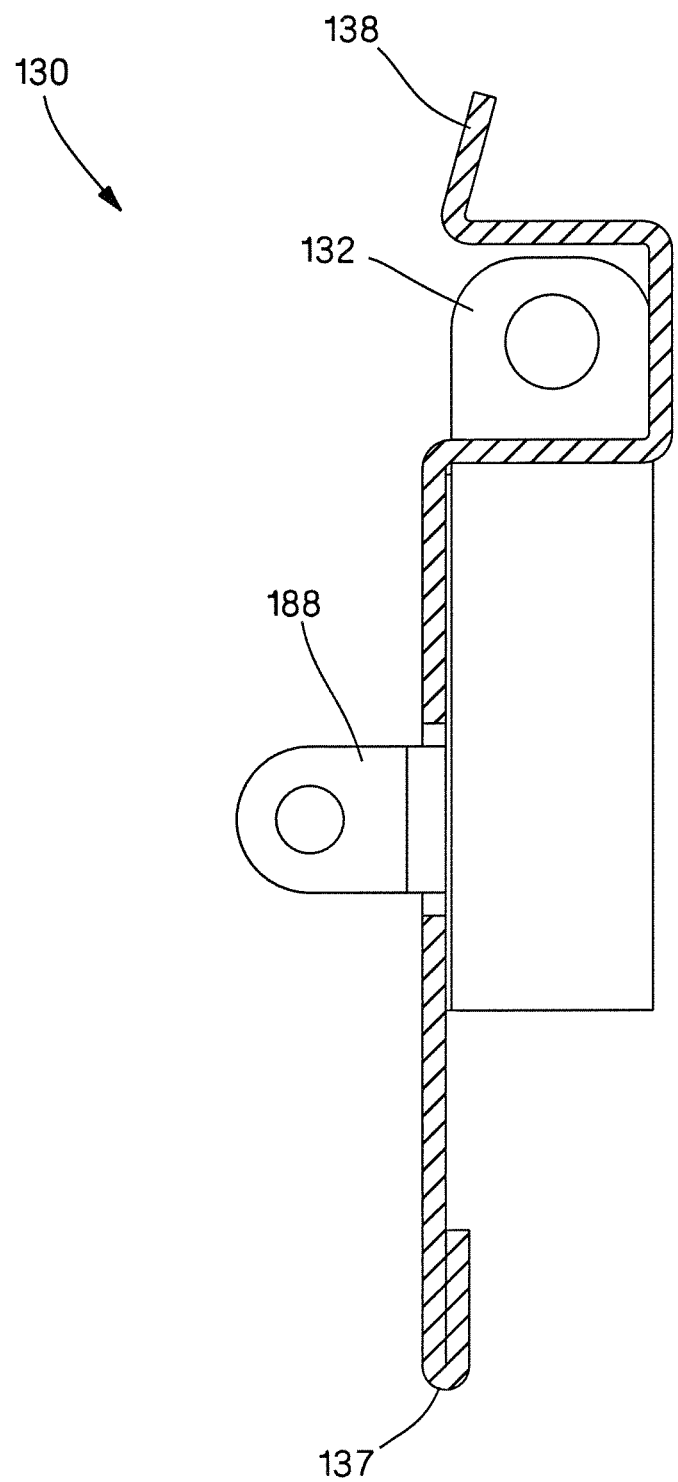
FIG. 18 is a cross-sectional view taken along line 18-18 of FIG. 2, showing the handle of the roller shade filler panel.

In certain embodiments of the present invention, the roller shade filler panel 100 includes an adjustable edge seal. For example, as shown in FIGS. 15-17, a top edge 117 of the base 110 includes an adjustable edge seal 119 for sealing against equipment 30 installed above the roller shade filler panel 100. Similarly, as shown in FIGS. 18-20, a bottom edge 137 of the handle 130 includes an adjustable edge seal 139 for sealing against equipment 30 installed below the roller shade filler panel 100.

In certain embodiments of the present invention, the roller shade filler panel 100 includes radio-frequency identification ("RFID"). For example, components of the roller shade filler panel 100, including the base 110 and the handle 130, as well as components of the rack 10, including the equipment rails 20, preferably at one rack unit ("1RU") intervals, and the equipment 30, include RFID tags to determine the location of the roller shade filler panel 100, for example, with respect to the rack 10, the equipment rails 20 and the equipment 30.

Figure 21:
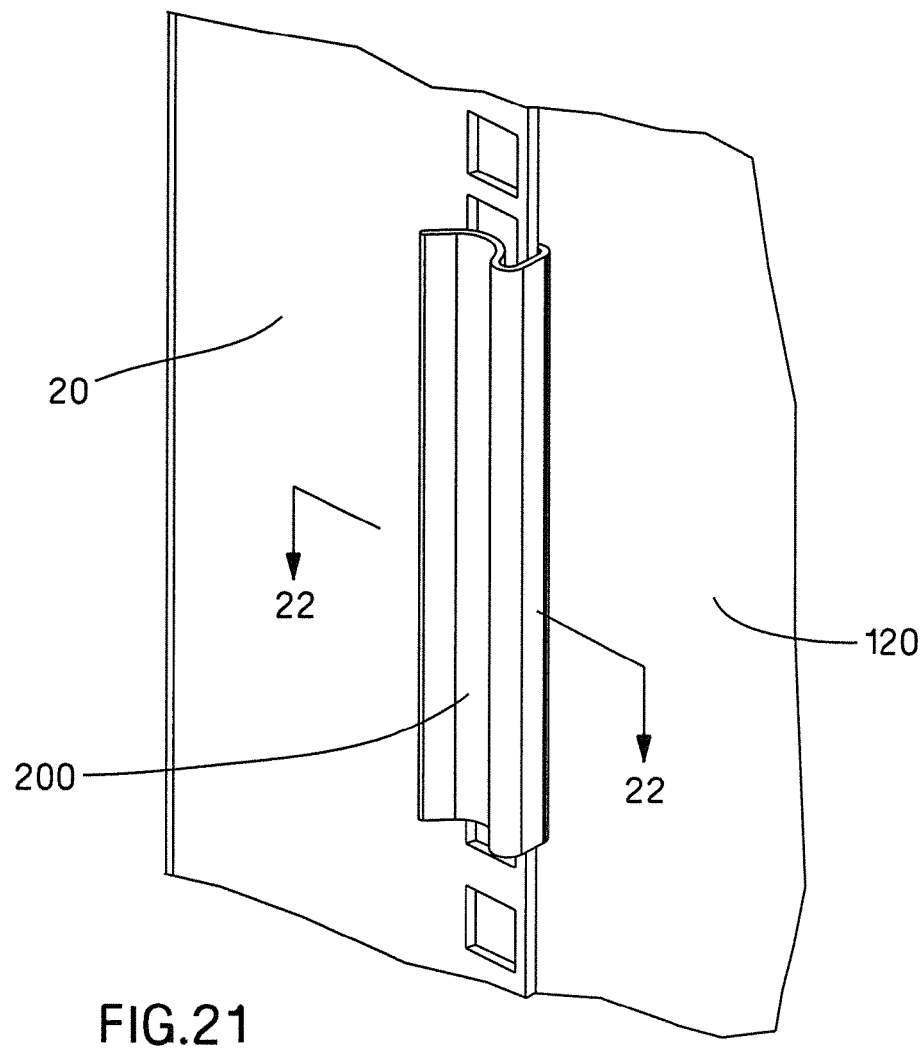
FIG. 21 is an enlarged view of the roller shade filler panel of FIG. 4, showing one of the clips for securing the roller shade to the equipment rails.
Figure 22:
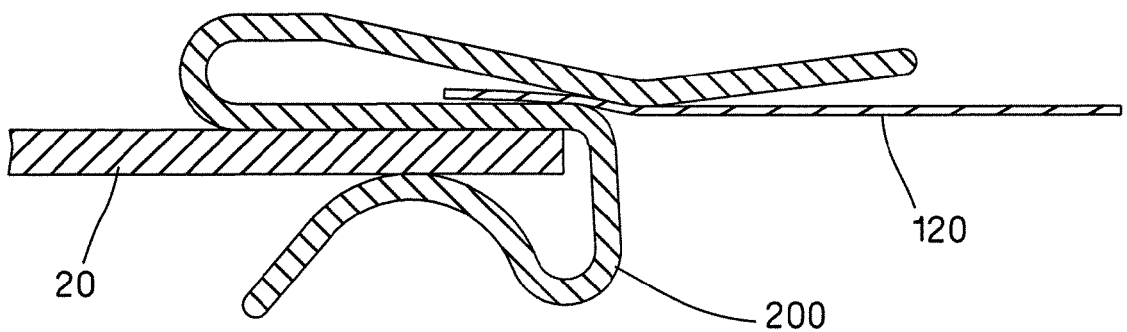
FIG. 22 is a cross-sectional view taken along line 22-22 of FIG. 21.

As best seen in FIGS. 21 and 22, but also shown in FIGS. 4, 9-12, and 14, the roller shade filler panel 100 includes one or more clips 200 for securing the roller shade 120 to the equipment rails 20.

While this invention has been described in conjunction with the exemplary embodiments outlined above, various alternatives, modifications, variations, and/or improvements, whether known or presently unforeseen, may become apparent. Accordingly, the exemplary embodiments of the invention as set forth above are intended to be illustrative, not limiting. Various changes may be made without departing from the spirit and scope of the invention.

The invention claimed:

1. An apparatus for closing off an opening above, below, or between electronic equipment in a rack, the rack comprising a pair of equipment rails, the electronic equipment mounted to the pair of equipment rails at one or more of a plurality of mounting locations, the apparatus comprising:
a base;
a roller shade rotatably connected to the base, the roller shade having a free end, the free end extending from the base when the roller shade is rotated; and
a handle connected to the free end of the roller shade,
wherein the base is removably connected to the pair of equipment rails at a first mounting location of the plurality of mounting locations, and
wherein the handle is removably connected to the pair of equipment rails at a second mounting location of the plurality of mounting locations, the second mounting location spaced apart from the first mounting location such that the free end of the roller shade is extended to close off the opening in the rack,
the handle further comprising a pair of slide latches engaging a respective pair of latch pins extending from the equipment rails at the second mounting location in a transverse direction relative to the pair of slide latches.

2. The apparatus of claim 1, wherein the base includes a pair of side flanges for receiving the roller shade.

3. The apparatus of claim 2, wherein each of the side flanges includes an embossed region.

4. The apparatus of claim 1, wherein the roller shade includes a pair of pins for rotatably connecting the roller shade to the base.

5. The apparatus of claim 1, wherein the roller shade includes a pair of end caps for minimizing side-to-side movement of the roller shade.

6. The apparatus of claim 1, wherein the roller shade includes a tensioning device.

7. The apparatus of claim 1, wherein the handle includes a mounting rod for securing the handle to the free end of the roller shade.

8. The apparatus of claim 7, wherein the free end of the roller shade includes a loop for receiving the mounting rod.

9. The apparatus of claim 1, wherein the base includes a guide rod for aligning the roller shade with the front of the base.

10. The apparatus of claim 1, wherein the handle includes a top flange for aligning the roller shade with the front of the handle.

11. The apparatus of claim 1, wherein the base includes a pair of threaded thumb screw knobs for securing the base to the equipment rails.

12. The apparatus of claim 1, further comprising a floating cage nut for removably connecting at least one of the base and the handle to one of the equipment rails, the floating cage nut having a first portion removably connected to one of the equipment rails and a second portion removably connected to the at least one of the base and the handle and slidably connected to the first portion such that the at least one of the base and the handle slides relative to the equipment rails.

13. The apparatus of claim 1, further comprising a clip for securing the roller shade to one of the equipment rails.

* * * * *